(12) United States Patent
Kim et al.

(10) Patent No.: US 11,769,834 B2
(45) Date of Patent: *Sep. 26, 2023

(54) THIN FILM TRANSISTOR AND DISPLAY SUBSTRATE HAVING THE SAME

(71) Applicant: Samsung Display Co., Ltd., Yongin-si (KR)

(72) Inventors: Jong Yun Kim, Yongin-si (KR); Taekyung Ahn, Yongin-si (KR); Youngdae Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/543,627

(22) Filed: Dec. 6, 2021

(65) Prior Publication Data

US 2022/0238722 A1 Jul. 28, 2022

Related U.S. Application Data

(63) Continuation of application No. 15/845,924, filed on Dec. 18, 2017, now Pat. No. 11,195,955, which is a
(Continued)

(30) Foreign Application Priority Data

Jan. 15, 2013 (KR) .................. 10-2013-0004527

(51) Int. Cl.
*H01L 29/786* (2006.01)
*H01L 29/45* (2006.01)
(Continued)

(52) U.S. Cl.
CPC ........ *H01L 29/78618* (2013.01); *C22C 27/04* (2013.01); *H01L 27/1225* (2013.01);
(Continued)

(58) Field of Classification Search
CPC ......... H01L 29/41733; H01L 29/78616; H01L 27/3262; H01L 27/1251; H01L 27/1255;
(Continued)

(56) References Cited

U.S. PATENT DOCUMENTS 5,124,768 A 6/1992 Mano et al.
6,512,504 B1 1/2003 Yamauchi et al.
(Continued)

FOREIGN PATENT DOCUMENTS

CN 102160104 8/2011
CN 102237373 11/2011
(Continued)

OTHER PUBLICATIONS

Office Action dated Aug. 5, 2019, issued in Korean Patent Application No. 10-2013-0004527.
(Continued)

*Primary Examiner* — Victoria K. Hall
(74) *Attorney, Agent, or Firm* — H.C. Park & Associates, PLC

(57) ABSTRACT

A display substrate including a base substrate, a first thin film transistor disposed on the base substrate and including a first gate electrode and a first semiconductor active layer; a second thin film transistor electrically connected to the first thin film transistor, the second thin film transistor including a second gate electrode and a second semiconductor active layer; and an organic light emitting device electrically connected to the second thin film transistor. The first semiconductor active layer includes a first material and the second semiconductor active layer includes a second material different from the first material.

16 Claims, 15 Drawing Sheets

Related U.S. Application Data continuation of application No. 15/052,485, filed on Feb. 24, 2016, now Pat. No. 9,859,435, which is a continuation of application No. 13/940,865, filed on Jul. 12, 2013, now Pat. No. 9,276,078.

(51) Int. Cl.
    *C22C 27/04*    (2006.01)
    *H01L 27/12*    (2006.01)
    *H10K 59/121*   (2023.01)

(52) U.S. Cl.
    CPC ...... *H01L 27/1251* (2013.01); *H01L 27/1255* (2013.01); *H01L 29/45* (2013.01); *H01L 29/454* (2013.01); *H01L 29/458* (2013.01); *H01L 29/7869* (2013.01); *H10K 59/1216* (2023.02); *H01L 2924/1205* (2013.01); *H01L 2924/13069* (2013.01); *H10K 59/1213* (2023.02)

(58) Field of Classification Search
    CPC ... H01L 27/3265; H01L 29/45; H01L 29/454; H01L 29/458; H01L 2924/1205; H01L 2924/13069; H01L 28/60
    See application file for complete search history.

(56) References Cited

U.S. PATENT DOCUMENTS

| | | | |
|---|---|---|---|
| 7,978,277 B2 * | 7/2011 | Kimura | H01L 29/42356 349/39 |
| 8,288,768 B2 | 10/2012 | Kim et al. | |
| 8,455,876 B2 * | 6/2013 | Choi | H01L 27/1225 438/164 |
| 8,669,558 B2 | 3/2014 | Liu et al. | |
| 8,674,359 B2 | 3/2014 | Noh et al. | |
| 9,257,082 B2 | 2/2016 | Kimura et al. | |
| 9,269,725 B2 | 2/2016 | Yamazaki | |
| 9,276,078 B2 * | 3/2016 | Kim | C22C 27/04 |
| 9,293,594 B2 | 3/2016 | Nishimura et al. | |
| 9,698,279 B2 | 7/2017 | Kim | |
| 9,859,435 B2 * | 1/2018 | Kim | H01L 29/45 |
| 10,340,320 B2 | 7/2019 | Lee et al. | |
| 10,714,557 B2 | 7/2020 | Lee et al. | |
| 10,903,246 B2 | 1/2021 | Lee et al. | |
| 11,195,955 B2 * | 12/2021 | Kim | H01L 29/458 |
| 2001/0019859 A1 | 9/2001 | Yamazaki | |
| 2002/0000553 A1 | 1/2002 | Wong | |
| 2002/0113239 A1 | 8/2002 | Uochi et al. | |
| 2003/0109087 A1 | 6/2003 | Dong et al. | |
| 2004/0041518 A1 | 3/2004 | Yoneda | |
| 2004/0080266 A1 | 4/2004 | Park et al. | |
| 2005/0085039 A1 | 4/2005 | Yasui et al. | |
| 2005/0200274 A1 | 9/2005 | Hiruma | |
| 2005/0282308 A1 | 12/2005 | Uhlig et al. | |
| 2006/0145162 A1 * | 7/2006 | Yang | H01L 27/1255 257/E27.113 |
| 2007/0152217 A1 * | 7/2007 | Lai | H01L 29/7869 438/149 |
| 2007/0155080 A1 | 7/2007 | Yoon | |
| 2008/0099764 A1 | 5/2008 | Choi et al. | |
| 2008/0230775 A1 * | 9/2008 | Rhee | H01L 27/1251 438/22 |
| 2009/0093093 A1 * | 4/2009 | Liu | H01L 29/458 257/E21.535 |
| 2009/0134399 A1 * | 5/2009 | Sakakura | H01L 51/0011 313/504 |
| 2010/0019996 A1 * | 1/2010 | You | H01L 27/1214 345/76 |
| 2010/0039454 A1 | 2/2010 | Nakamura et al. | |
| 2010/0072467 A1 | 3/2010 | Yamazaki et al. | |
| 2010/0084969 A1 | 4/2010 | Choi et al. | |
| 2010/0140613 A1 * | 6/2010 | Kimura | G02F 1/136277 257/E29.094 |
| 2010/0182223 A1 | 7/2010 | Choi et al. | |
| 2010/0255618 A1 | 10/2010 | Choi | |
| 2010/0270541 A1 | 10/2010 | Liu et al. | |
| 2010/0308326 A1 | 12/2010 | Kim et al. | |
| 2011/0037068 A1 * | 2/2011 | Yamazaki | H01L 29/78603 257/E29.296 |
| 2011/0049523 A1 * | 3/2011 | Choi | H01L 27/1225 438/34 |
| 2011/0057186 A1 | 3/2011 | Yamazaki et al. | |
| 2011/0057918 A1 | 3/2011 | Kimura et al. | |
| 2011/0090191 A1 * | 4/2011 | Lee | H10K 50/11 345/206 |
| 2011/0108844 A1 | 5/2011 | Kwak et al. | |
| 2011/0115839 A1 | 5/2011 | Takahashi et al. | |
| 2011/0175082 A1 | 7/2011 | Kim et al. | |
| 2011/0181560 A1 | 7/2011 | Yamazaki | |
| 2011/0227063 A1 | 9/2011 | Yun et al. | |
| 2011/0254061 A1 | 10/2011 | Yan et al. | |
| 2011/0272696 A1 | 11/2011 | Ryu et al. | |
| 2011/0278565 A1 | 11/2011 | Yim et al. | |
| 2011/0297951 A1 | 12/2011 | Shin et al. | |
| 2011/0303923 A1 * | 12/2011 | Noh | H01L 29/4908 257/E21.409 |
| 2011/0303930 A1 | 12/2011 | Bang et al. | |
| 2012/0112181 A1 | 5/2012 | Lee et al. | |
| 2012/0132920 A1 * | 5/2012 | Park | H01L 27/3265 438/34 |
| 2012/0161132 A1 | 6/2012 | Yamazaki | |
| 2012/0211750 A1 | 8/2012 | Kakinuma | |
| 2013/0001566 A1 | 1/2013 | Jeong et al. | |
| 2013/0015448 A1 | 1/2013 | Yang et al. | |
| 2013/0015449 A1 | 1/2013 | Lee et al. | |
| 2013/0033655 A1 | 2/2013 | Miyamoto | |
| 2013/0044095 A1 * | 2/2013 | Heo | H01L 27/3276 438/34 |
| 2013/0122667 A1 | 5/2013 | Kondo et al. | |
| 2013/0168666 A1 * | 7/2013 | Yan | H01L 27/1251 257/E21.409 |
| 2013/0214279 A1 | 8/2013 | Nishimura et al. | |
| 2013/0334530 A1 | 12/2013 | Katoh et al. | |
| 2014/0027736 A1 * | 1/2014 | You | H01L 27/124 438/34 |

FOREIGN PATENT DOCUMENTS

| | | |
|---|---|---|
| CN | 102254928 | 11/2011 |
| CN | 102953036 | 3/2013 |
| JP | 2010-003910 | 7/2010 |
| KR | 10-1997-0054489 | 7/1997 |
| KR | 10-0657534 | 12/2006 |
| KR | 10-2011-0084005 | 7/2011 |
| KR | 1020110124530 | 11/2011 |
| KR | 10-2013-0020569 | 2/2013 |
| TW | 201246526 | 11/2012 |
| TW | 201301599 | 1/2013 |
| WO | 2011135908 A1 | 11/2011 |

OTHER PUBLICATIONS

Non-Final Office Action dated Apr. 16, 2018, in U.S. Appl. No. 15/845,924.
Final Office Action dated Oct. 24, 2018, in U.S. Appl. No. 15/845,924.
Non-Final Office Action dated Feb. 5, 2019, in U.S. Appl. No. 15/845,924.
Final Office Action dated Jul. 5, 2019, in U.S. Appl. No. 15/845,924.
Non-Final Office Action dated Sep. 16, 2019, in U.S. Appl. No. 15/845,924.
Final Office Action dated Feb. 12, 2020, in U.S. Appl. No. 15/845,924.
Non-Final Office Action dated Jun. 23, 2020, in U.S. Appl. No. 15/845,924.
Final Office Action dated Dec. 24, 2020, in U.S. Appl. No. 15/845,924.
Non-Final Office Action dated Apr. 1, 2021, in U.S. Appl. No. 15/845,924.
Notice of Allowance dated Aug. 3, 2021, in U.S. Appl. No. 15/845,924.
Final Office Action dated May 30, 2017, issued in U.S. Appl. No. 15/052,485.

(56) References Cited

OTHER PUBLICATIONS

Non-Final Office Action dated Nov. 14, 2016, issued in U.S. Appl. No. 15/052,485.
Notice of Allowance dated Sep. 20, 2017, issued in U.S. Appl. No. 15/052,485.
Jolanta Niedbala, Otrzymywanie I Struktura Elektrolitycznych Warstw Kompozytowych Zawierajacych Tytan W Osnowie Stopowej Ni-Mo, Kompoztyt (Composites), vol. 3, No. 6, 2003, all pages.

\* cited by examiner

THIN FILM TRANSISTOR AND DISPLAY SUBSTRATE HAVING THE SAME

CROSS-REFERENCE TO RELATED APPLICATIONS

This application is a Continuation of U.S. application Ser. No. 15/845,924, filed on Dec. 18, 2017, now issued as U.S. Pat. No. 11,195,955, which is a Continuation of U.S. application Ser. No. 15/052,485, filed on Feb. 24, 2016, now issued as U.S. Pat. No. 9,859,435, which is a Continuation of U.S. application Ser. No. 13/940,865, filed on Jul. 12, 2013, now issued as U.S. Pat. No. 9,276,078, and claims priority from and the benefit of Korean Application No. 10-2013-0004527, filed on Jan. 15, 2013, each of which is hereby incorporated by reference for all purpose as if fully set forth herein.

BACKGROUND OF THE INVENTION

Field of the Invention

The present invention relates to a thin film transistor and a display substrate having the same. More particularly, the present invention relates to a thin film transistor applied to an active type display device and a display substrate having the thin film transistor.

Description of the Related Art

In general, a display substrate is applied to a flat panel display device, e.g., a liquid crystal display device, an organic electroluminescent display device, etc., to realize lightweight and thin thickness of the flat panel display device.

The display substrate includes pixels arranged in a matrix form and displays an image by applying a source voltage to each pixel. The display substrate includes gate lines and data lines crossing the gate lines, and the gate lines are insulated from the data lines by an insulating layer. Each gate line is connected to a thin film transistor disposed in each pixel and applies a signal to the thin film transistor to control the thin film transistor. The thin film transistor switches a voltage applied to a corresponding pixel of the pixels. In addition, each data line applies the voltage to the corresponding pixel of the pixels.

Meanwhile, source and drain electrodes of the thin film transistor and the data line are formed of a conductive material, such as aluminum, copper, etc. However, aluminum and copper are vulnerable to corrosion and oxidation.

SUMMARY OF THE INVENTION

The present invention provides a thin film transistor capable of preventing source and drain electrodes from being corroded.

The present invention provides a display substrate having the thin film transistor.

Embodiments of the invention provide a thin film transistor including a semiconductor active layer that includes a source region and a drain region, a gate electrode insulated from the semiconductor active layer, a source electrode making contact with the source region, and a drain electrode making contact with the drain region. Each of the source and drain electrodes includes a first conductive layer that includes one of copper, a copper alloy, aluminum, and an aluminum alloy, and a second conductive layer disposed on the first conductive layer and including a molybdenum-nickel alloy.

The molybdenum-nickel alloy contains nickel of about 10 at % to about 50 at % with respect to an aggregate of the molybdenum-nickel alloy.

Each of the source electrode and the drain electrode further includes a third conductive layer disposed under the first conductive layer and including a same material as the second conductive layer. The second conductive layer and the third conductive layer include a molybdenum-nickel-titanium alloy. The molybdenum-nickel-titanium alloy contains nickel of about 15 at % to about 30 at % with respect to an aggregate of the molybdenum-nickel-titanium alloy and titanium of about 10 at % to about 20 at % with respect to the aggregate of the molybdenum-nickel-titanium alloy.

Embodiments of the invention provide a display substrate including a base substrate, a semiconductor active layer disposed on the base substrate, a first conductive pattern group insulated from the semiconductor active layer and including at least a gate electrode, a second conductive pattern group insulated from the first conductive pattern group and including at least a source electrode, a drain electrode and a data pad, and an organic light emitting device connected to the drain electrode. The second conductive pattern group includes a first conductive layer and a second conductive layer disposed on the first conductive layer, and the second conductive layer prevents the first conductive layer from being corroded and oxidized.

The first conductive layer includes one of copper, a copper alloy, aluminum, and an aluminum alloy, and the second conductive layer includes a molybdenum-nickel alloy.

The semiconductor active layer includes a semiconductor oxide, and the semiconductor oxide includes at least one of Zn, In, Ga, Sn, or a mixture thereof.

Embodiments of the invention provide a display substrate including a base substrate, a first thin film transistor disposed on the base substrate, a second thin film transistor disposed on the base substrate and electrically connected to the first thin film transistor, and an organic light emitting device connected to the second thin film transistor. The first thin film transistor includes a first semiconductor active layer, a first gate electrode, a first source electrode, and a first drain electrode, and the second thin film transistor includes a second semiconductor active layer, a second gate electrode, a second source electrode, and a second drain electrode. The first source electrode, the first drain electrode, the second source electrode, and the second drain electrode are disposed on a same layer, and each of the first source electrode, the first drain electrode, the second source electrode, and the second drain electrode includes a first conductive that includes one of copper, a copper alloy, aluminum, and an aluminum alloy, and a second conductive layer disposed on the first conductive layer and including a molybdenum-nickel alloy.

According to the above, each of the source electrode, the drain electrode, and the data line includes the conductive layer of molybdenum-nickel alloy, and thus the source electrode, the drain electrode, and the data line may be prevented from being corroded and oxidized.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
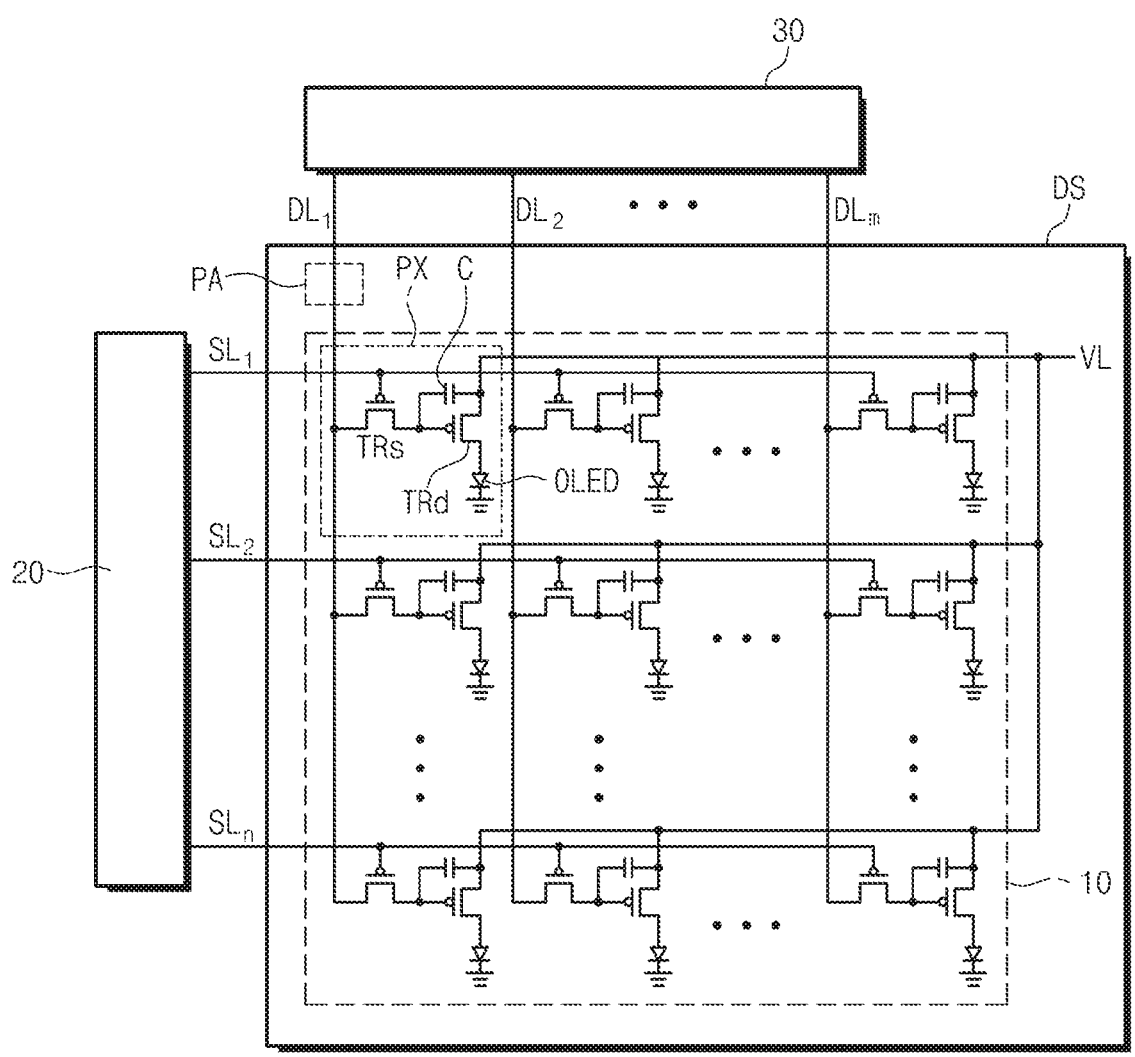
FIG. 1 is a circuit diagram showing a flat panel display device including a display substrate according to an exemplary embodiment of the present invention.

It will be understood that, when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention applies. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a circuit diagram showing a flat panel display device including a display substrate according to an exemplary embodiment of the present invention.

Referring to FIG. 1, a display substrate DS may be applied to a flat panel display device, such as a liquid crystal display device, an organic electroluminescent display device, etc. In the present exemplary embodiment, the organic electroluminescent display device to which the display substrate DS is applied will be described as a representative example.

The organic electroluminescent display device includes the display substrate DS including a display part 10, a scan driver 20, and a data driver 30.

The scan driver 20 and the data driver 30 are electrically connected to the display part 10 through signal lines. The signal lines include scan lines $SL_1$, $SL_2$, and SLn, data lines $DL_1$, $DL_2$, and DLm, and source voltage supply lines VL, and any one of the signal lines crosses the other signal lines.

In detail, the scan driver 20 is electrically connected to the display part 10 by the scan lines $SL_1$, $SL_2$, and SLn. The scan driver 20 applies scan signals to the display part 10 through the scan lines $SL_1$, $SL_2$, and SLn. The scan lines $SL_1$, $SL_2$, and SLn are extended in a first direction on the display substrate DS.

The data driver 30 is electrically connected to the data lines $DL_1$, $DL_2$, and DLm through a pad (not shown) disposed in a pad area PA of the display substrate DS. Accordingly, the data driver 30 is electrically connected to the display part 10 through the data lines $DL_1$, $DL_2$, and DLm. The data driver 30 applies data signals to the display part 10 through the data lines $DL_1$, $DL_2$, and DLm.

The data lines $DL_1$, $DL_2$, and DLm are extended in a second direction different from the first direction so as to cross the scan lines $SL_1$, $SL_2$, and SLn. Thus, the data lines $DL_1$, $DL_2$, and DLm cross the scan lines $SL_1$, $SL_2$, and SLn.

The source voltage supply lines VL apply a source voltage to the display part 10. The source voltage supply lines VL cross the data lines $DL_1$, $DL_2$, and DLm and the scan lines $SL_1$, $SL_2$, and SLn.

The display part 10 includes a plurality of pixels PX. Each pixel PX is electrically connected to a corresponding data line of the data lines $DL_1$, $DL_2$, and DLm, a corresponding scan line of the scan lines $SL_1$, $SL_2$, and SLn, and a corresponding source voltage supply line of the source voltage supply lines VL. Each pixel PX includes a switching thin film transistor TRs, a driving thin film transistor TRd, a capacitor C, and an organic light emitting device OLED.

The switching thin film transistor TRs is connected to a corresponding data line of the data lines $DL_1$, $DL_2$, and DLm and to a corresponding scan line of the scan lines $SL_1$, $SL_2$, and SLn. Each of the switching thin film transistor TRs and the driving thin film transistor TRd includes a semiconductor active layer, a gate electrode insulated from the semiconductor active layer, and source and drain electrodes making contact with the semiconductor active layer.

According to the organic electroluminescent display device, the scan signals are applied to the pixels PX through the scan lines $SL_1$, $SL_2$, and SLn from the scan driver 20 and the data signals are applied to the pixels PX through the data lines $DL_1$, $DL_2$, and DLm from the data driver 30. The switching thin film transistor TRs of each pixel PX turns on or off the driving thin film transistor TRd in response to the scan signal and the data signal. The driving thin film transistor TRd applies a driving current to the organic light emitting device OLED according to the data signal. The organic light emitting device OLED generates light using the driving current.

Meanwhile, the capacitor C, which maintains the data signal during a predetermined time period, is connected between the drain electrode of the switching thin film transistor TRs and the gate electrode of the driving thin film transistor TRd. The data signal charged in the capacitor C applies the data signal to the gate electrode of the driving thin film transistor TRd after the switching thin film transistor TRs is turned off.

Although not shown in detail, the organic electroluminescent display device may further include additional thin film transistors and capacitors in order to compensate for a threshold voltage of the driving thin film transistor TRd.

Hereinafter, the structure of the display substrate DS will be described in detail with reference to FIGS. 2 and 3A to 3C, and a direction in which the switching thin film transistor TRs, the driving thin film transistor TRd and the organic light emitting device OLED are disposed within the display substrate DS will be referred to as "upper portion".

Figure 2:
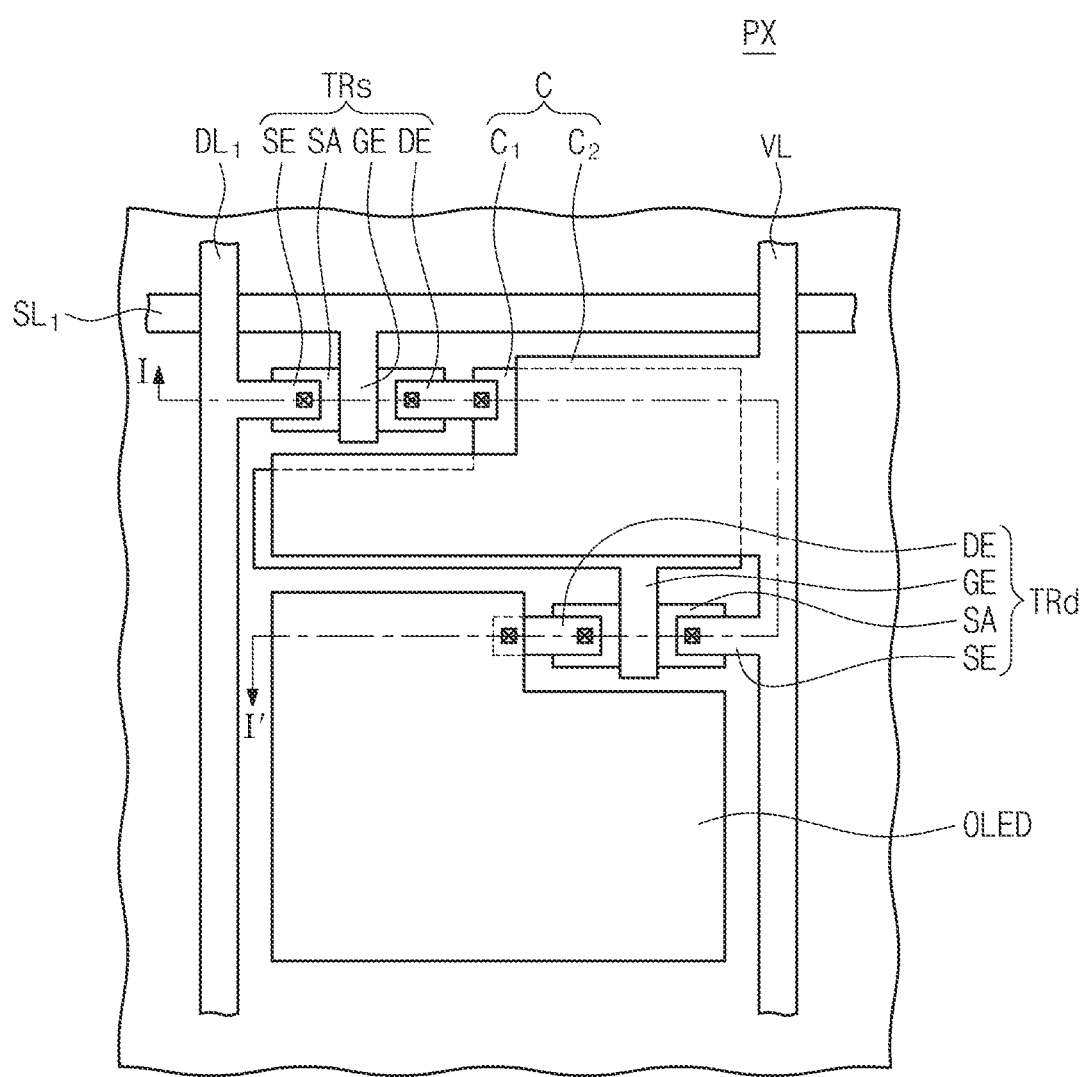
FIG. 2 is a plan view showing one pixel shown in FIG. 1.

FIG. 2 is a plan view showing one pixel shown in FIG. 1, and FIG. 3A to FIG. 3C are cross-sectional views taken along a line I-I' shown in FIG. 2.

Figure 3A:
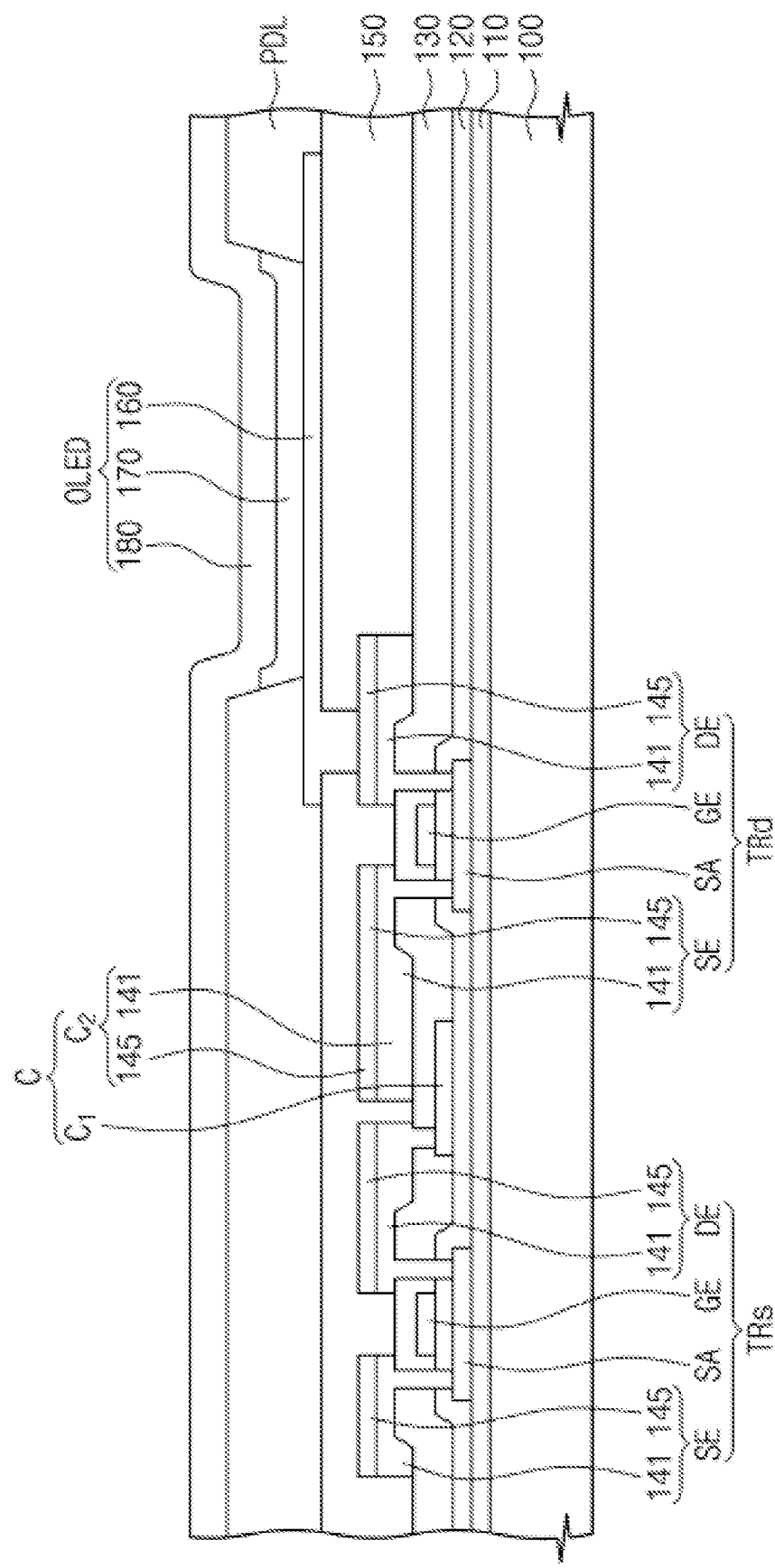
FIGS. 3A, 3B, and 3C are cross-sectional views taken along a line I-I' shown in FIG. 2.

Referring to FIGS. 2 and 3A, the pixel PX of the display substrate DS is electrically connected to the corresponding data line $DL_1$ of the data lines $DL_1$, $DL_2$, and DLm, the corresponding scan line $SL_1$ of the scan lines $SL_1$, SU, and SLn, and the corresponding source voltage supply line VL of the source voltage supply lines VL. Each pixel PX includes the switching thin film transistor TRs, the driving thin film transistor TRd, the capacitor C electrically connected to the switching thin film transistor TRs and the driving thin film transistor TRd, and the organic light emitting device OLED.

The switching thin film transistor TRs is connected to the corresponding data line $DL_1$ and the corresponding scan line $SL_1$. Each switching thin film transistor TRs and each driving thin film transistor TRd includes the semiconductor active layer SA, the gate electrode GE insulated from the semiconductor active layer SA, and source and drain electrodes SE and DE making contact with the semiconductor active layer SA.

In more detail, each switching thin film transistor TRs and each driving thin film transistor TRd includes the semiconductor active layer SA, the gate electrode GE insulated from the semiconductor active layer SA, and source and drain electrodes SE and DE making contact with the semiconductor active layer SA, which are disposed on a base substrate 100 formed of a transparent glass or plastic material.

The semiconductor active layer SA includes poly-silicon p-Si or oxide semiconductor. In addition, the semiconductor active layer SA includes a source region making contact with the source electrode SE, a drain region making contact with the drain electrode DE, and a channel region disposed between the source region and the drain region. To this end, the source and drain regions are doped with impurities. The oxide semiconductor includes at least one of Zn, In, Ga, Sn, or a mixture thereof. For instance, the oxide semiconductor may include indium-gallium-zinc oxide (IGZO).

Although not shown in the figures, when the semiconductor active layer SA includes the oxide semiconductor, a light blocking layer may be disposed on and under the oxide semiconductor active layer SA to block the light traveling to the oxide semiconductor active layer SA.

Meanwhile, a buffer layer 110 is disposed between the semiconductor active layer SA and the base substrate 100. The buffer layer 110 may be a silicon oxide layer or a silicon nitride layer, or may have a multi-layer structure of the silicon oxide layer and the silicon nitride layer. The buffer layer 110 prevents impurities from being diffused to the switching thin film transistor TRs, the driving thin film transistor TRd, and the organic light emitting device OLED, and prevents moisture or oxygen from being infiltrated into the switching thin film transistor TRs, the driving thin film transistor TRd, and the organic light emitting device OLED. In addition, the buffer layer 110 planarizes a surface of the base substrate 100.

A gate insulating layer 120 is disposed on the semiconductor active layer SA and the base substrate 100 to cover the semiconductor active layer SA and the base substrate 100, and thus the semiconductor active layer SA and the gate electrode GE are insulated from each other. The gate insulating layer 120 includes silicon oxide (SiO2) and/or silicon nitride (SiNx).

The scan line $SL_1$ is disposed on the gate insulating layer 120 and extended in the direction. A portion of the scan line $SL_1$ is extended to the pixel PX to serve as the gate electrode GE overlapped with the channel region of the semiconductor active layer SA.

An inter-insulating layer 130 is disposed on the gate insulating layer 120 and the gate electrode GE. The inter-insulating layer 130 includes silicon oxide or silicon nitride as the gate insulating layer 120. In addition, the inter-insulating layer 130 is provided with contact holes to expose a portion of the source region and a portion of the drain region.

The data line $DL_1$ and the source voltage supply line VL, which cross the scan line $SL_1$, and the source electrode SE and the drain electrode DE, which are insulated from the gate electrode GE, are disposed on the inter-insulating layer 130. The source electrode SE and the drain electrode DE make contact with the source region and the drain region, respectively, through the contact holes. The source electrode SE and the drain electrode DE include a conductive metal and a conductive polymer.

The data line $DL_1$, the source voltage supply line VL, the source electrode SE, and the drain electrode DE include a first conductive layer 141 disposed on the inter-insulating layer 130 and a second conductive layer 145 disposed on the first conductive layer 141. The second conductive layer 145 blocks the diffusion of materials included in the first conductive layer 141 and prevents the first conductive layer 141 from being corroded or oxidized. For instance, the first conductive layer 141 includes copper (Cu), copper alloy (Cu-alloy), aluminum (Al), or aluminum alloy (Al-alloy) and the second conductive layer 145 includes molybdenum alloy (Mo-alloy). The molybdenum alloy includes molybdenum-nickel alloy (Mo—Ni alloy) and contains nickel of about 10 at % to about 50 at % with respect to an aggregate of the molybdenum-nickel alloy.

The capacitor C includes a first capacitor electrode $C_1$ and a second capacitor electrode $C_2$.

The first capacitor electrode $C_1$ is formed of the same material as, and disposed on the same layer as, the scan lines $SL_1$, $SL_2$, and SLn and the gate electrode GE. That is, the first capacitor electrode $C_1$ is disposed on the gate insulating layer 120.

Figure 3B:
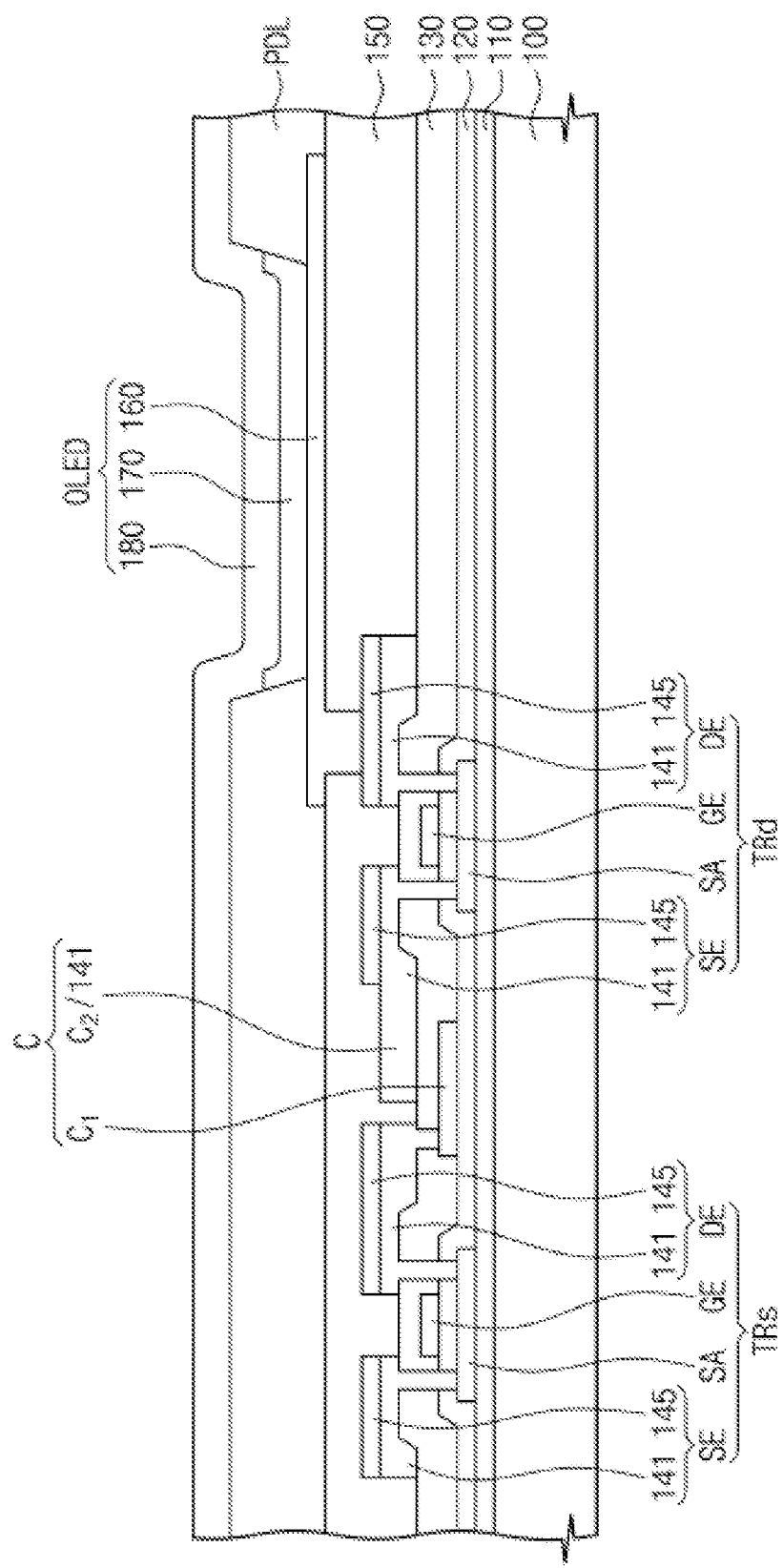
Figure 3C:
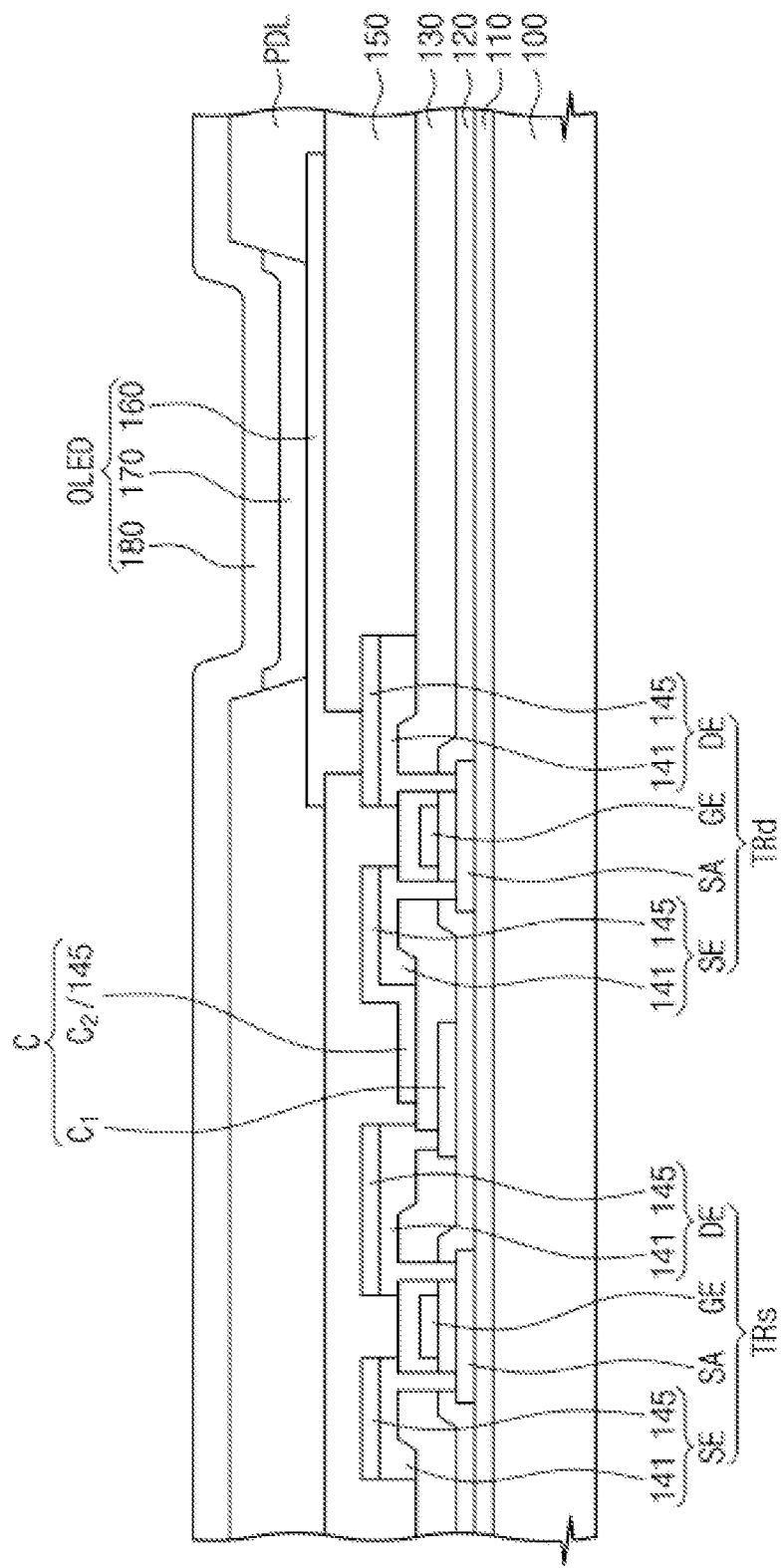

The second capacitor electrode $C_2$ is formed of the same material as, and disposed on the same layer as, the data line $DL_1$, the source voltage supply line VL, the source electrode SE, and the drain electrode DE. That is, the second capacitor electrode $C_2$ is disposed on the inter-insulating layer 130 and has a double-layer structure of the first conductive layer 141 and the second conductive layer 145. As shown in FIGS. 3B. and 3C. one of the first and second conductive layers 141 and 145 may be removed from the second capacitor electrode $C_2$.

A protective layer 150 is disposed on the switching thin film transistor TRs, the driving thin film transistor TRd, and the capacitor C. The protective layer 150 may include at least one layer. In detail, the protective layer 150 includes an inorganic protective layer and an organic protective layer disposed on the inorganic protective layer. The inorganic protective layer includes at least one of silicon oxide or silicon nitride. In addition, the organic protective layer includes acryl, polyimide, polyamide, or benzocyclobutene. That is, the organic protective layer may have transparency and fluidity to planarize a lower layer thereof.

The organic light emitting device OLED is disposed on the protective layer 150. In addition, the organic light emitting device OLED includes a first electrode 160 making contact with the drain electrode DE of the driving thin film transistor TRd, a pixel definition layer PDL exposing a portion of the first electrode 160, an organic layer 170 disposed on the exposed portion of the first electrode 160, and a second electrode 180 disposed on the organic layer 170. Here, one of the first electrode 160 and the second electrode 180 is an anode electrode and the other one of the first electrode 160 and the second electrode 180 is a cathode electrode. In the present exemplary embodiment, the first electrode 160 serves as the anode electrode and the second electrode 180 serves as the cathode electrode.

The first electrode 160 includes a transparent conductive oxide, e.g., indium tin oxide (ITO), indium zinc oxide (IZO), aluminum zinc oxide (AZO), gallium-doped zinc oxide (GZO), zinc tin oxide (ZTO), gallium tin oxide (GTO), fluorine-doped tin oxide (FTO), etc. The first electrode 160 may include a semi-transparent reflective layer to improve a light emitting efficiency of the organic light emitting device OLED.

The organic layer 170 is disposed on the portion of the first electrode 160 exposed by the pixel definition layer PDL. The organic layer 170 includes at least a light emitting layer EML and may have a multi-layer structure. For instance, the organic layer 170 includes a hole injection layer (HIL) that injects holes, a hole transport layer (HTL) that controls electrons, which are not combined with the holes in the light emitting layer EML, to enhance combination opportunities between the holes and the electrons, the light emitting layer EML that emits light using recombination of the holes and the electrons, a hole blocking layer (HBL) that controls movement of the holes not combined with the electrons, an electron transport layer (ETL) that transports the electrons to the light emitting layer EML, and an electron injection layer (EIL) that injects the electrons.

In addition, the light emitted from the organic layer 170 has one of red, green, blue, and white colors. For instance, when the organic light emitting device OLED is an RGB type, the color of the light emitting from the organic layer 170 of each pixel PX is one of the red, green, and blue colors. In addition, the organic light emitting device OLED is a WOLED type, the color of the light emitting from the organic layer 170 of each pixel PX being white. In the present exemplary embodiment, the color of the light emitted from the organic layer 170 is red, green, blue or white, but it should not be limited thereto or thereby. That is, the color of the light emitted from the organic layer 170 may be magenta, cyan, or yellow.

The second electrode 180 may include at least one of Mo, MoW, Cr, Al, AlNd, or aluminum alloy, has a work function lower than that of the first electrode 160, and reflects light.

In the present exemplary embodiment, the light emitted from the organic layer 170 travels to the first electrode 160, but it should not be limited thereto or thereby. For instance, in a case wherein the first electrode 160 includes a reflective layer (not shown) to reflect the light generated by the organic layer 170, and the second electrode 180 transmits the light, the light generated by the organic layer 170 may travel to the second electrode 180.

Figure 4:
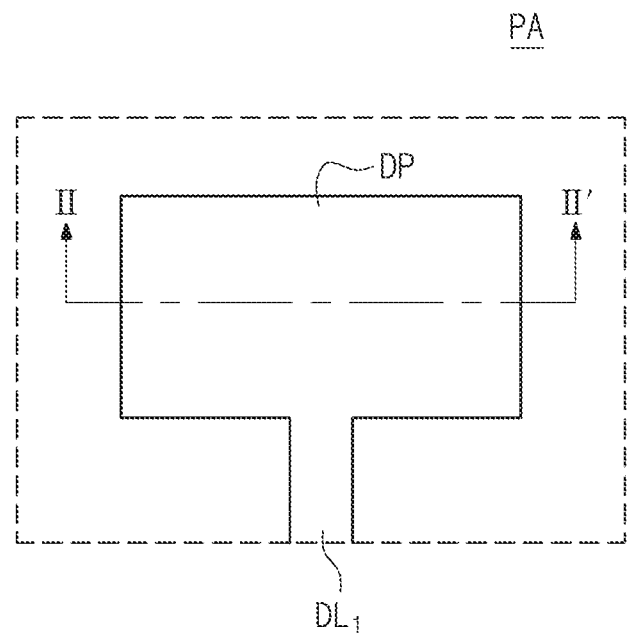
FIG. 4 is an enlarged view showing a portion PA shown in FIG. 1.
Figure 5:
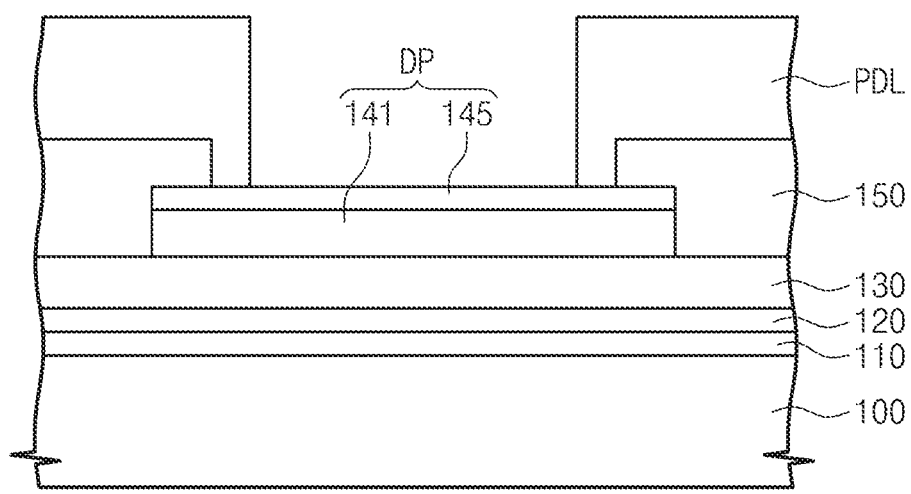
FIG. 5 is a cross-sectional view taken along a line II-If shown in FIG. 4.

FIG. 4 is an enlarged view showing a pad area PA shown in FIG. 1 and FIG. 5 is a cross-sectional view taken along a line II-II' shown in FIG. 4.

Referring to FIGS. 4 and 5, a data pad PD is disposed in the pad area PA of the display substrate DS of FIG. 1 and is electrically connected to the data line $DL_1$.

The data pad PD has the same structure as the data line DLL In detail, the data pad PD includes the first conductive layer 141 disposed on the inter-insulating layer 130 and the second conductive layer 145 disposed on the first conductive layer 141. The second conductive layer 145 blocks the diffusion of materials included in the first conductive layer 141 and prevents the first conductive layer 141 from being corroded or oxidized. For instance, the first conductive layer 141 includes copper (Cu), copper alloy (Cu-alloy), aluminum (Al), or aluminum alloy (Al-alloy) and the second conductive layer 145 includes molybdenum alloy (Mo-alloy). The molybdenum alloy includes molybdenum-nickel alloy (Mo—Ni alloy) and contains nickel of about 10 at % to about 50 at % with respect to an aggregate of the molybdenum-nickel alloy.

Hereinafter, a pixel of a display substrate will be described with reference to FIGS. 6 to 13 according to exemplary embodiments of the present invention. In FIGS. 6 to 13, the same reference numerals denote the same elements in as seen in FIGS. 1 to 5, and thus detailed descriptions of the same elements will be omitted.

Figure 6:
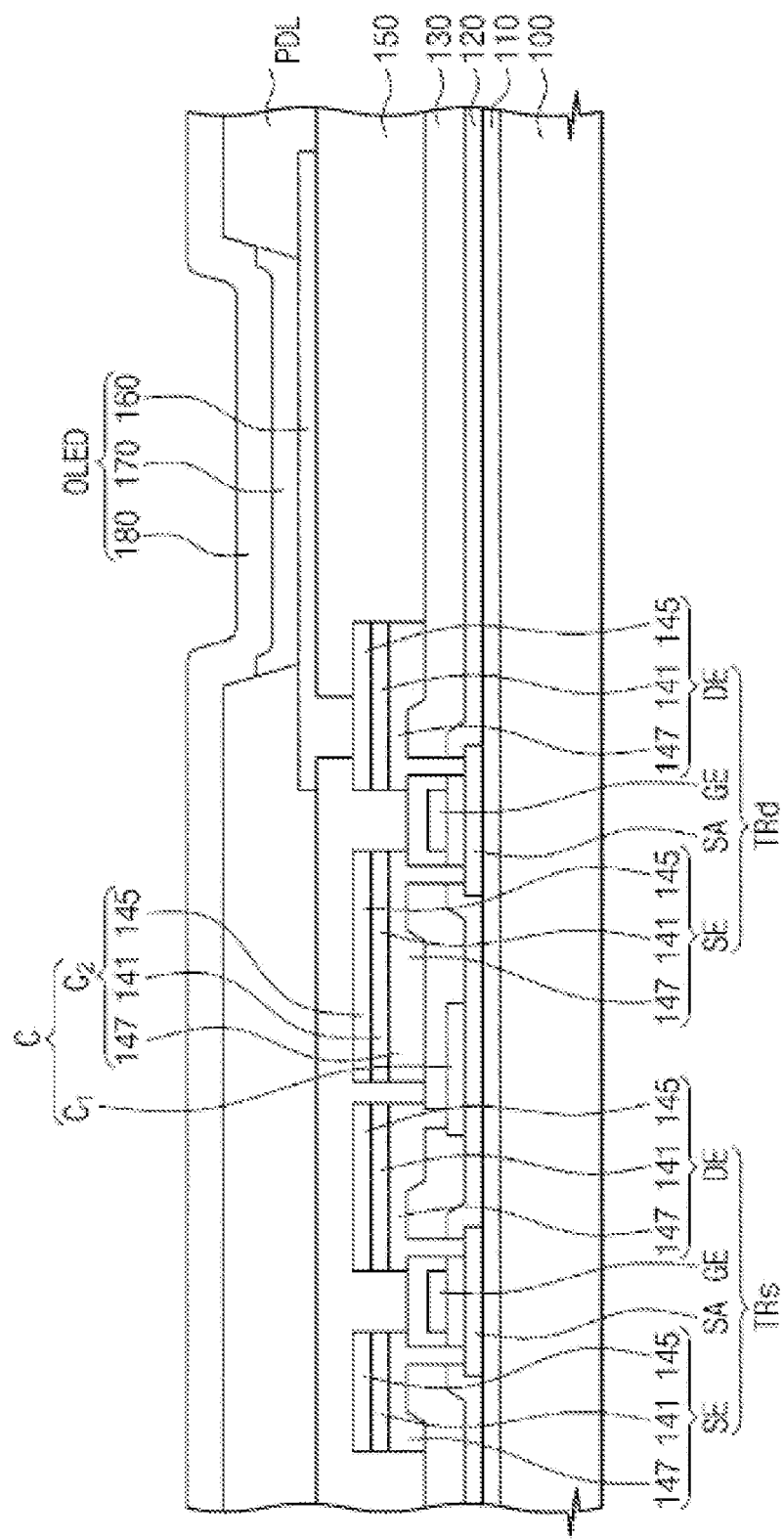
FIG. 6 is a cross-sectional view showing a pixel of a display substrate according to another exemplary embodiment of the present invention.
Figure 7:
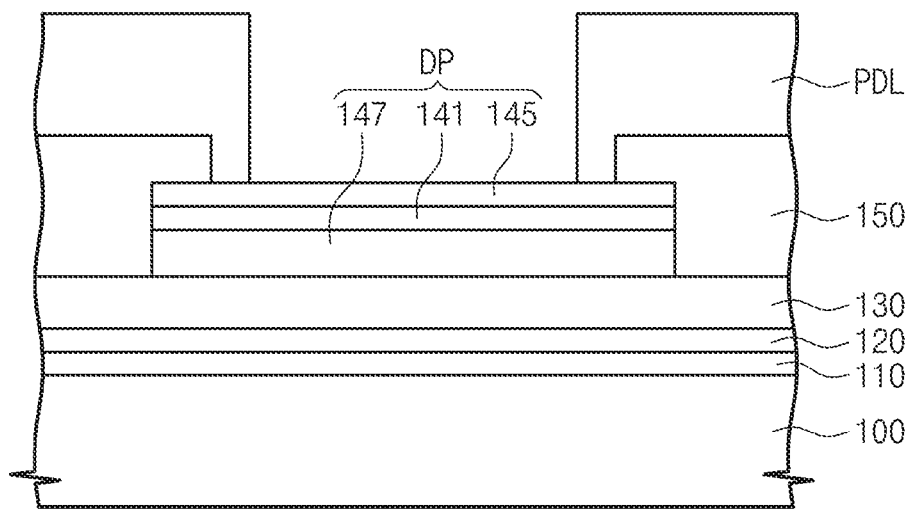
FIG. 7 is a cross-sectional view showing a pad area of a display substrate according to another exemplary embodiment of the present invention.

FIG. 6 is a cross-sectional view showing a pixel of a display substrate according to another exemplary embodiment of the present invention, and FIG. 7 is a cross-sectional view showing a pad area of a display substrate according to another exemplary embodiment of the present invention.

Referring to FIGS. 6 and 7, each pixel of the display substrate DS includes a switching thin film transistor TRs, a driving thin film transistor TRd, a capacitor C electrically connected to the switching thin film transistor TRs and the driving thin film transistor TRd, and an organic light emitting device OLED making electrical contact with the driving thin film transistor TRd. In addition, a data pad PD is disposed in the pad area PA of the display substrate DS so as to be electrically connected to the data line $DL_1$.

The switching thin film transistor TRs is connected to the scan line $SL_1$ and the data line $DL_1$ and the driving thin film transistor TRd is connected to the capacitor C and the source voltage supply line VL. Each of the switching thin film transistor TRs and the driving thin film transistor TRd includes a semiconductor active layer SA, a gate electrode GE insulated from the semiconductor active layer SA, and source and drain electrodes SE and DE making contact with the semiconductor active layer SA.

Each of the data line $DL_1$, the source voltage supply line VL, the source electrode SE, the drain electrode DE, and the data pad PD includes the first conductive layer 141 disposed on the inter-insulating layer 130, the second conductive layer 145 disposed on the first conductive layer 141, and a third conductive layer 147 disposed under the first conductive layer 141.

The first conductive layer 141 includes one of copper (Cu), copper alloy (Cu-alloy), aluminum (Al), and aluminum alloy (Al-alloy).

The second and third conductive layers 145 and 147, respectively, may have the same material. The second and third conductive layers 145 and 147, respectively, block the diffusion of materials included in the first conductive layer 141 and prevent the first conductive layer 141 from being corroded or oxidized. The second and third conductive layers 145 and 147, respectively, may include molybdenum alloy (Mo-alloy). The molybdenum alloy may be molybdenum(Mo)-nickel(Ni)-titanium(Ti) alloy. The molybdenum alloy contains nickel of about 15 at % to about 30 at % with respect to an aggregate of the molybdenum alloy and titanium of about 10 at % to about 20 at % with respect to the aggregate of the molybdenum alloy.

The capacitor C includes a first capacitor electrode $C_1$ and a second capacitor electrode $C_2$. The first capacitor electrode $C_1$ is formed of the same material as, and is disposed on the same layer as, the scan line $SL_1$ and the gate electrode GE.

The second capacitor electrode $C_2$ is formed of the same material as, and is disposed on the same layer as, the data line $DL_1$, the source voltage supply line VL, the source electrode SE, and the drain electrode DE. That is, the second capacitor electrode $C_2$ includes the first conductive layer 141 disposed on the inter-insulating layer 130, the second conductive layer 145 disposed on the first conductive layer 141, and the third conductive layer 147 disposed under the first conductive layer 141.

In addition, the organic light emitting device OLED includes the first electrode 160 making contact with the drain electrode DE of the driving thin film transistor TRd, the pixel definition layer PDL exposing the portion of the first electrode 160, the organic layer 170 disposed on the exposed portion of the first electrode 160, and the second electrode 180 disposed on the organic layer 170.

Figure 8:
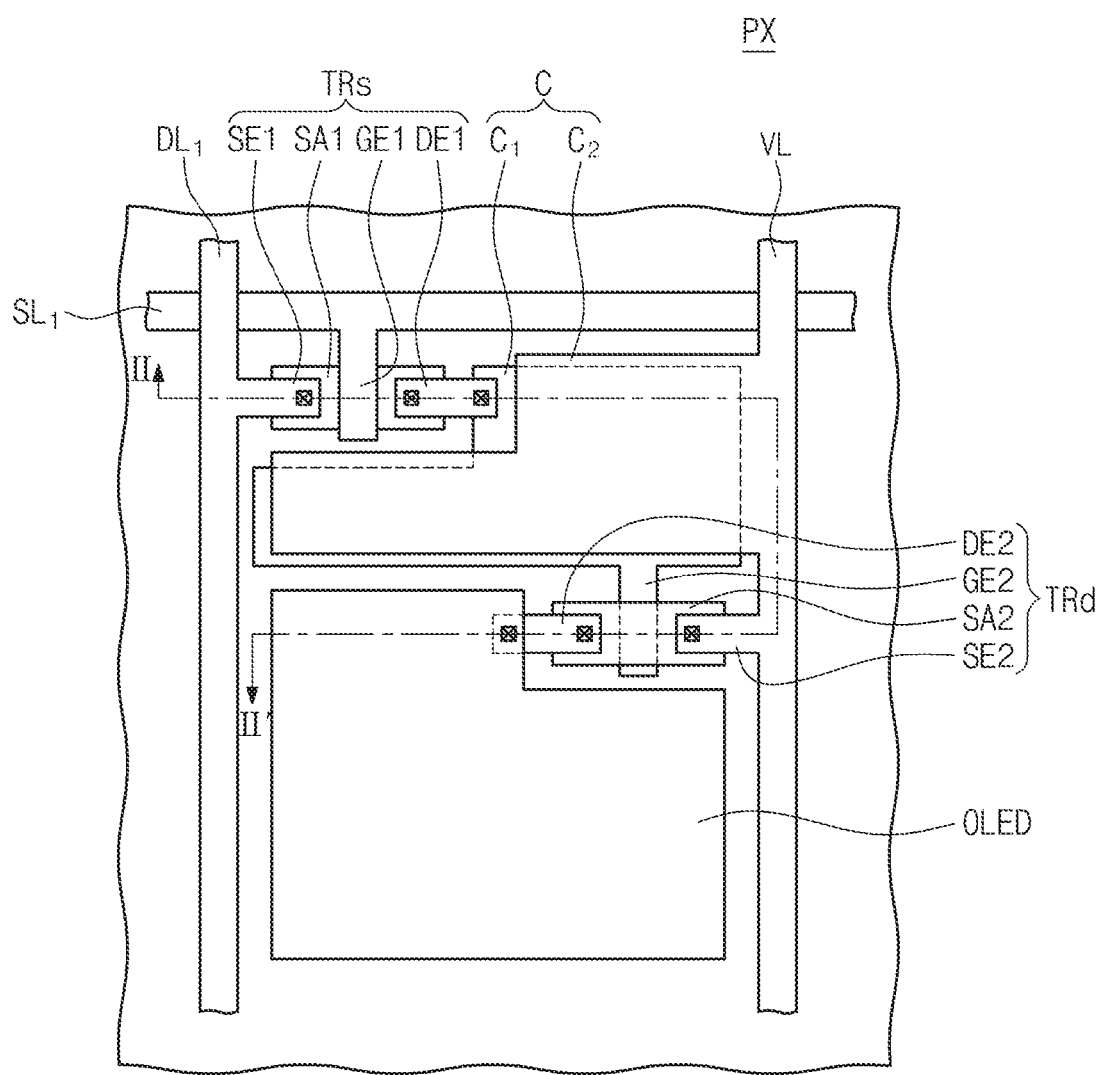
FIG. 8 is a plan view showing a pixel of a display substrate according to another exemplary embodiment of the present invention.
Figure 9:
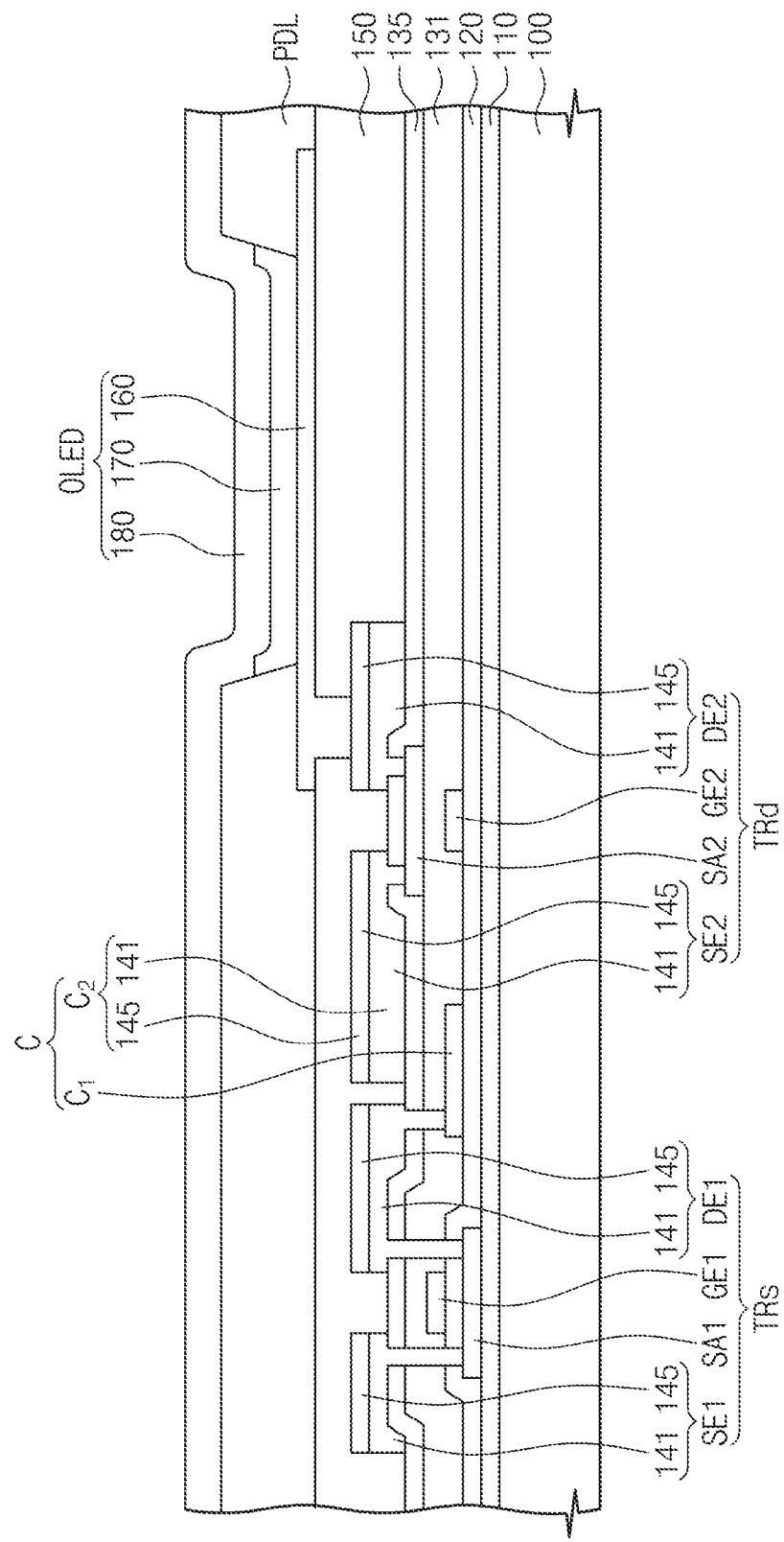
FIG. 9 is a cross-sectional view taken along a line II-If shown in FIG. 8.
Figure 10:
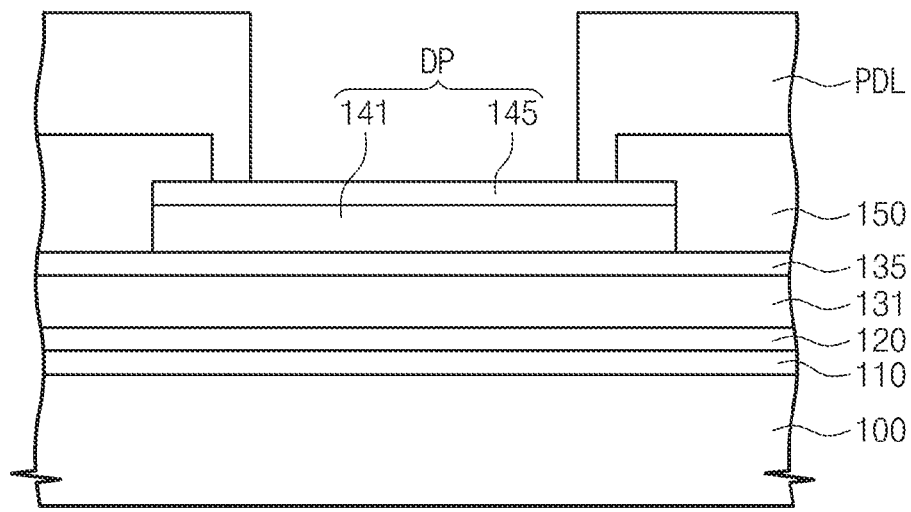
FIG. 10 is a cross-sectional view showing a pad area of a display substrate according to another exemplary embodiment of the present invention.

FIG. 8 is a plan view showing a pixel of a display substrate according to another exemplary embodiment of the present invention, FIG. 9 is a cross-sectional view taken along a line II-IP shown in FIG. 8, and FIG. 10 is a cross-sectional view showing a pad area of a display substrate according to another exemplary embodiment of the present invention.

Referring to FIGS. 8 to 10, each pixel of the display substrate DS is electrically connected to the data line $DL_1$, the scan line $SL_1$, and the source voltage supply line VL. Each pixel includes a switching thin film transistor TRs, a driving thin film transistor TRd, a capacitor C electrically connected to the switching thin film transistor TRs and the driving thin film transistor TRd, and an organic light emitting device OLED making electrical contact with the driving thin film transistor TRd. In addition, a data pad PD is disposed in the pad area PA of the display substrate DS so as to be electrically connected to the data line DLL The switching thin film transistor TRs is connected to the scan line $SL_1$ and the data line $DL_1$, and the driving thin film transistor TRd is connected to the capacitor C and the source voltage supply line VL. One of the switching thin film transistor TRs and the driving thin film transistor TRd, e.g., the switching thin film transistor TRs, may have a top gate structure, and the other one of the switching thin film transistor TRs and the driving thin film transistor TRd, e.g., the driving thin film transistor TRd, may have a bottom gate structure.

The switching thin film transistor TRs includes a first semiconductor active layer SA1 disposed on the base substrate 100, a first gate electrode GE1 insulated from the first semiconductor active layer SA1, and a first source electrode SE1 and a first drain electrode DE1 which make contact with the first semiconductor active layer SA1.

The driving thin film transistor TRd includes a second gate electrode GE2 disposed on the gate insulating layer 120, a second semiconductor active layer SA2 insulated from and overlapped with the second gate electrode GE, and a second source electrode SE2 and a second drain electrode DE2 which make contact with the second semiconductor active layer SA2.

The capacitor C includes a first capacitor electrode $C_1$ and a second capacitor electrode $C_2$.

In detail, a buffer layer 110 is disposed on the base substrate 100 and the first semiconductor active layer SA1 is disposed on the buffer layer 110.

The first semiconductor active layer SA1 includes poly-silicon (p-Si) or oxide semiconductor. In the present exemplary embodiment, the first semiconductor active layer SA1 includes poly-silicon (p-Si).

A gate insulating layer 120 is disposed on the first semiconductor active layer SA1 and the buffer layer 110 so as to cover the first semiconductor active layer SA1, so that the first semiconductor active layer SA1 is insulated from the first gate electrode GE1.

The scan line $SL_1$, the first gate electrode GE1 extended from the scan line $SL_1$ and overlapped with the channel region of the first semiconductor active layer SA1, the first capacitor electrode $C_1$, and the second gate electrode GE2 are disposed on the gate insulating layer 120.

A first inter-insulating layer 131 is disposed on the first gate electrode GE1, the first capacitor electrode $C_1$, the second gate electrode GE2, and the gate insulating layer 120.

A second semiconductor active layer SA2 is disposed on the first inter-insulating layer 131 so as to overlap with the second gate electrode GE2. That is, the first inter-insulating layer 131 serves as the gate insulating layer of the driving thin film transistor TRd. In addition, the second semiconductor active layer SA2 includes amorphous silicon (a-Si) or oxide semiconductor. For instance, the second semiconductor active layer SA2 includes oxide semiconductor, and the oxide semiconductor includes at least one of Zn, In, Ga, Sn, or a mixture thereof.

A second inter-insulating layer 135 is disposed on the second semiconductor active layer SA2 and the first inter-insulating layer 131.

The data line $DL_1$, the source voltage supply line VL, the first source electrode SE1, the first drain electrode DE1, the second capacitor electrode $C_2$, the second source electrode SE2, and the second drain electrode DE2 are disposed on the second inter-insulating layer 135.

Each of the first source electrode SE1, the first drain electrode DE1, the second capacitor electrode $C_2$, the data line $DL_1$, the source voltage supply line VL, the second source electrode SE2, the second drain electrode DE2, and the data pad PD includes a first conductive layer 141 disposed on the second inter-insulating layer 131 and a second conductive layer 145 disposed on the first conductive layer 141. Here, the second conductive layer 145 blocks the diffusion of materials included in the first conductive layer 141 and prevents the first conductive layer 141 from being corroded or oxidized. For instance, the first conductive layer 141 includes copper (Cu), copper alloy (Cu-alloy), aluminum (Al), or aluminum alloy (Al-alloy) and the second conductive layer 145 includes molybdenum alloy (Mo-alloy). The molybdenum alloy includes molybdenum-nickel alloy (Mo—Ni alloy) and contains nickel of about 10 at % to about 50 at % with respect to an aggregate of the molybdenum-nickel alloy.

In addition, the organic light emitting device OLED includes the first electrode 160 making contact with the drain electrode DE of the driving thin film transistor TRd, the pixel definition layer PDL exposing a portion of the first electrode 160, the organic layer 170 disposed on the exposed portion of the first electrode 160, and the second electrode 180 disposed on the organic layer 170.

Figure 11:
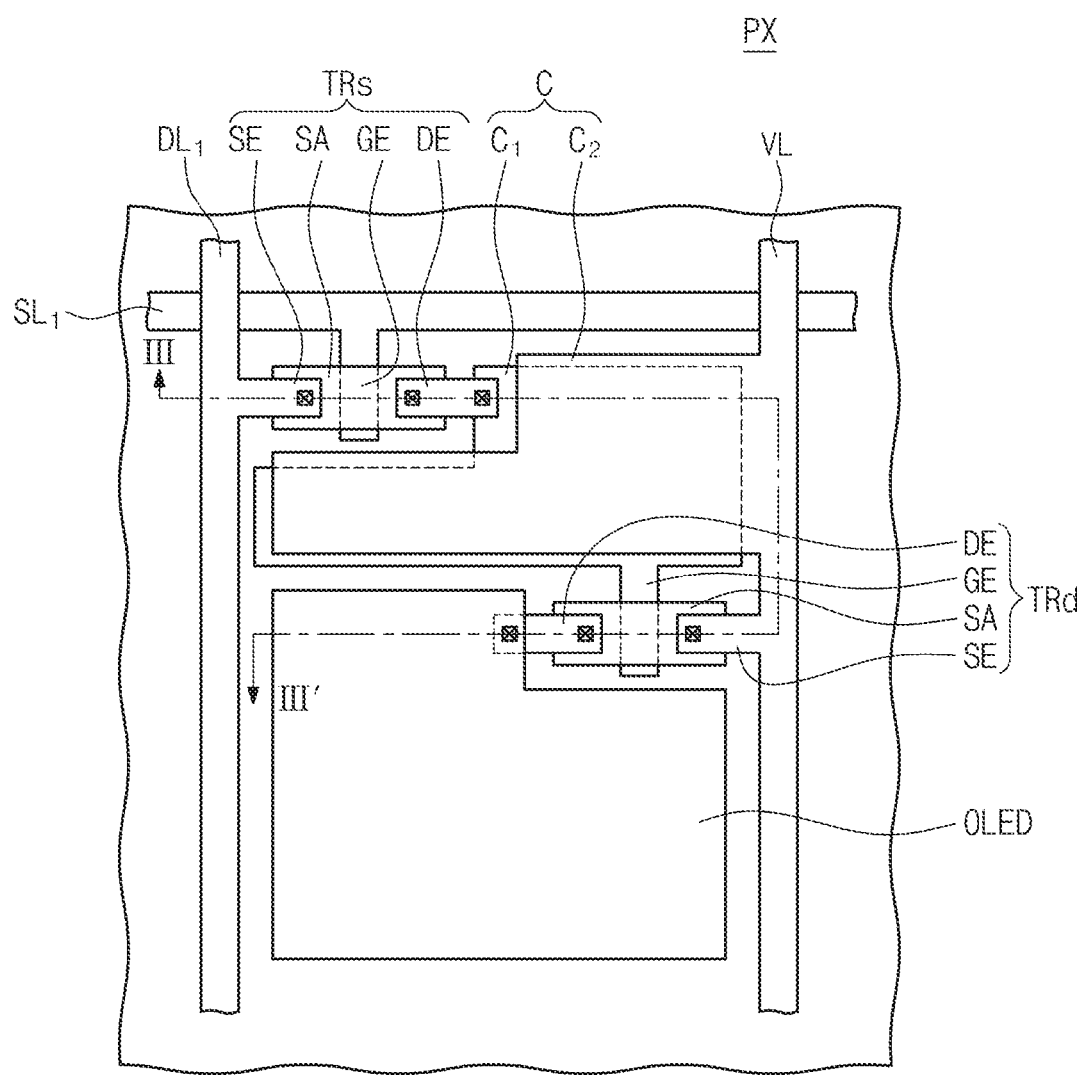
FIG. 11 is a plan view showing a pixel of a display substrate according to another exemplary embodiment of the present invention.
Figure 12:
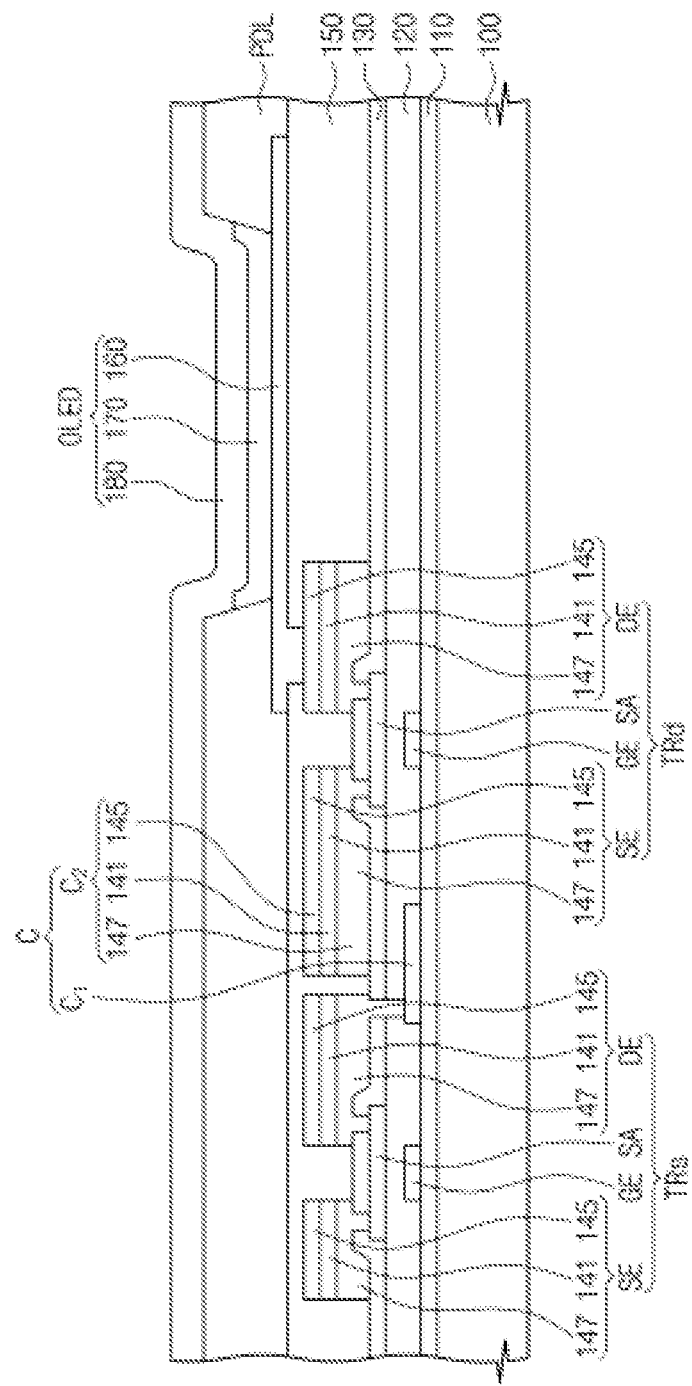
FIG. 12 is a cross-sectional view taken along a line shown in FIG. 11.
Figure 13:
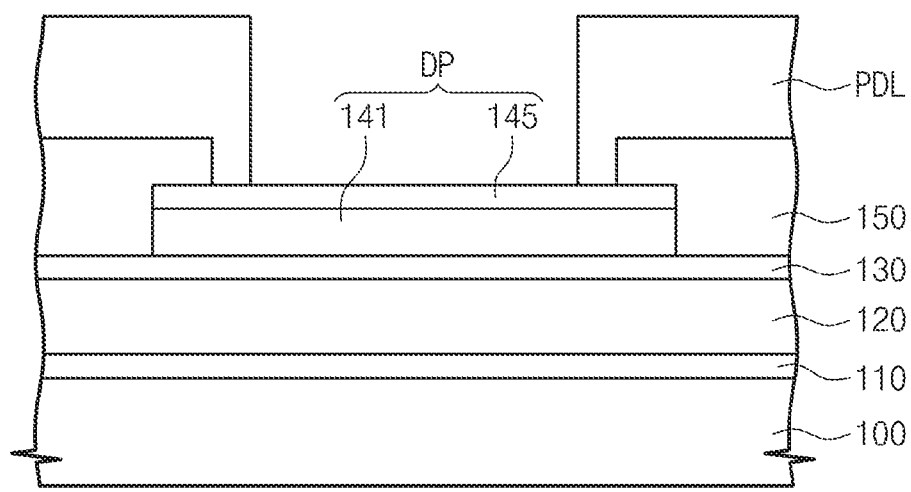
FIG. 13 is a cross-sectional view showing a pad area of a display substrate according to another exemplary embodiment of the present invention.

FIG. 11 is a plan view showing a pixel of a display substrate according to another exemplary embodiment of the present invention, FIG. 12 is a cross-sectional view taken along a line shown in FIG. 11, and FIG. 13 is a cross-sectional view showing a pad area of a display substrate according to another exemplary embodiment of the present invention.

Referring to FIGS. 11 to 13, each pixel PX of the display substrate DS is electrically connected to the data line $DL_1$, the scan line $SL_1$, and the source voltage supply line VL. Each pixel PX includes a switching thin film transistor TRs, a driving thin film transistor TRd, a capacitor C electrically connected to the switching thin film transistor TRs and the driving thin film transistor TRd, and an organic light emitting device OLED making electrical contact with the driving thin film transistor TRd. In addition, a data pad PD is disposed in the pad area PA of the display substrate DS so as to be electrically connected to the data line $DL_1$.

The switching thin film transistor TRs is connected to the scan line $SL_1$ and the data line $DL_1$, and the driving thin film transistor TRd is connected to the capacitor C and the source voltage supply line VL. Both the switching thin film transistor TRs and the driving thin film transistor TRd may have a bottom gate structure.

The switching thin film transistor TRs and the driving thin film transistor TRd include a semiconductor active layer SA, a gate electrode GE insulated from the semiconductor active layer SA, and a source electrode SE and a drain electrode DE which make contact with the semiconductor active layer SA.

The capacitor C includes a first capacitor electrode $C_1$ and a second capacitor electrode $C_2$.

Each of the data line $DL_1$, the source voltage supply line VL, the source electrode SE, the drain electrode DE, and the data pad PD includes first conductive layer 141 disposed on the inter-insulating layer 130, second conductive layer 145 disposed on the first conductive layer 141, and third conductive layer 147 disposed under the first conductive layer 141.

The first conductive layer 141 includes copper (Cu), copper alloy (Cu-alloy), aluminum (Al), or aluminum alloy (Al-alloy).

The second conductive layer 145 and the third conductive layer 147 include the same material. The second and third conductive layers 145 and 147, respectively, block the diffusion of materials included in the first conductive layer 141, and prevent the second conductive layer 145 from being corroded or oxidized. The second and third conductive layers 145 and 147, respectively, include molybdenum alloy (Mo-alloy). The molybdenum alloy includes molybdenum-nickel-titanium alloy (Mo—Ni—Ti alloy) and contains nickel of about 15 at % to about 30 at % with respect to an aggregate of the molybdenum alloy and titanium of about 10 at % to about 20 at % with respect to the aggregate of the molybdenum alloy.

In addition, the organic light emitting device OLED includes first electrode 160 making contact with the drain electrode DE of the driving thin film transistor TRd, pixel definition layer PDL exposing a portion of the first electrode 160, organic layer 170 disposed on the exposed portion of the first electrode 160, and second electrode 180 disposed on the organic layer 170.

Figure 14:
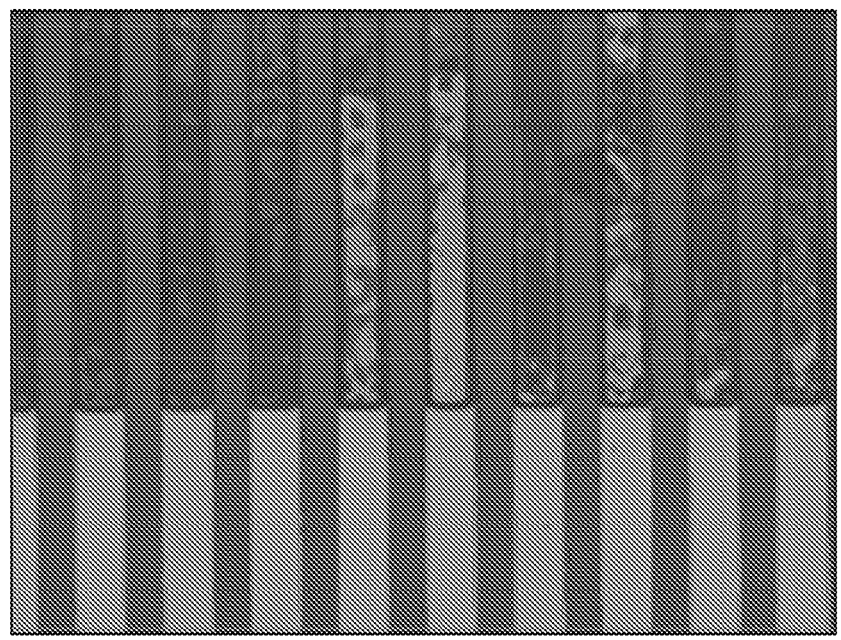
FIG. 14 is a view showing an experimental result of corrosion and oxidation of a conductive layer of Mo/Al/Mo under high temperature and moisture conditions.
Figure 15:
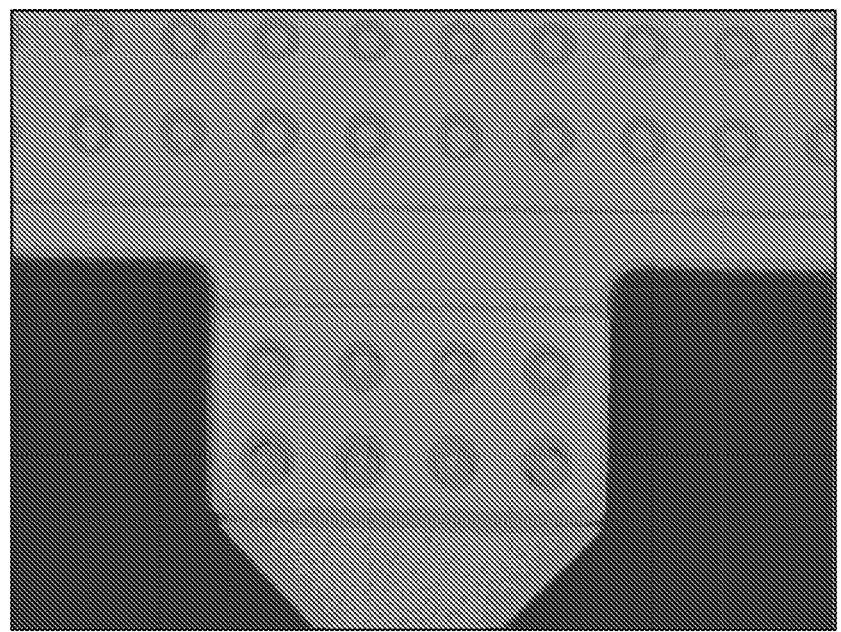
FIG. 15 is a view showing an experimental result of corrosion and oxidation of a conductive layer of Mo—Ni—Ti alloy/Al/Mo—Ni—Ti alloy under high temperature and moisture conditions.

FIG. 14 is a view showing an experimental result of corrosion and oxidation of a conductive layer of Mo/Al/Mo under high temperature and moisture conditions, and FIG. 15 is a view showing an experimental result of corrosion and oxidation of a conductive layer of Mo—Ni—Ti alloy/Al/Mo—Ni—Ti alloy under high temperature and moisture conditions.

Referring to FIG. 14, when the conductive layer having the structure of Mo/Al/Mo is exposed to the conditions of a temperature of about 85 degrees and an absolute humidity of about 85 percent during about 240 hours, corrosion occurs in the conductive layer.

Referring to FIG. 15, when the conductive layer having the structure of Mo—Ni—Ti alloy/Al/Mo—Ni—Ti alloy is exposed to the conditions of the temperature of about 85 degrees and the absolute humidity of about 85 percent during about 240 hours, corrosion does not occur in the conductive layer.

That is, the Al layer is prevented from being corroded by the Mo—Ni—Ti alloy disposed on and under the Al layer.

Although exemplary embodiments of the present invention have been described, it is understood that the present invention should not be limited to these exemplary embodiments but various changes and modifications can be made by one of ordinary skill in the art within the spirit and scope of the present invention as hereinafter claimed.

What is claimed is:

1. A display substrate, comprising:
   a base substrate;
   a first buffer layer disposed on the base substrate;

a first semiconductor active layer disposed on the first buffer layer;
a gate insulating layer disposed on the first semiconductor active layer;
a first gate electrode disposed on the gate insulating layer to correspond to the first semiconductor active layer;
a second gate electrode disposed on the gate insulating layer;
a first inter-insulating layer disposed on the gate insulating layer to cover the first gate electrode and the second gate electrode;
a second semiconductor active layer disposed on the first inter-insulating layer to correspond to the second gate electrode;
a second inter-insulating layer covering the second semiconductor active layer;
first and second electrodes disposed on the second inter-insulating layer and making contact with the first semiconductor active layer;
third and fourth electrodes disposed on the second inter-insulating layer and making contact with the second semiconductor active layer; and
a capacitor comprising a first capacitor electrode and a second capacitor electrode,
wherein:
the first semiconductor active layer comprises a first material and the second semiconductor active layer comprises a second material different from the first material;
the first capacitor electrode is disposed on the gate insulating layer and under the second inter-insulating layer;
second capacitor electrode is disposed on the second inter-insulating layer;
at least one of the first to fourth electrodes comprises:
a first conductive layer; and
a second conductive layer disposed on the first conductive layer and electrically connected to the first conductive layer;
the second capacitor electrode is integrally formed and continuous with the third electrode; and
the second capacitor electrode consists of the first conductive layer or the second conductive layer.

2. The display substrate of claim 1, wherein the first material comprises an oxide semiconductor, and the second material comprises polysilicon.

3. The display substrate of claim 2, wherein the oxide semiconductor comprises at least one of Zn, In, Ga, Sn, and a mixture thereof.

4. The display substrate of claim 1, wherein the first material comprises poly-silicon, and the second material comprises an oxide semiconductor.

5. The display substrate of claim 4, wherein the oxide semiconductor comprises at least one of Zn, In, Ga, Sn, and a mixture thereof.

6. The display substrate of claim 1, further comprising an organic light emitting device electrically connected to one of the first to fourth electrodes.

7. The display substrate of claim 1, wherein at least one of the first to fourth electrodes comprises:
the first conductive layer;
the second conductive layer; and
a third conductive layer disposed under the first conductive layer.

8. The display substrate of claim 7, wherein the first conductive layer comprises aluminum, and the second and third conductive layers comprise titanium.

9. The display substrate of claim 1, wherein each of the first and second gate electrodes comprises molybdenum.

10. The display substrate of claim 1, wherein each of the first to fourth electrodes comprises molybdenum.

11. A display substrate, comprising:
a base substrate;
a first buffer layer disposed on the base substrate;
a first semiconductor active layer disposed on the first buffer layer;
a gate insulating layer disposed on the first semiconductor active layer;
a first gate electrode disposed on the gate insulating layer to correspond to the first semiconductor active layer;
a second gate electrode disposed on the gate insulating layer;
a first inter-insulating layer disposed on the gate insulating layer to cover the first gate electrode and the second gate electrode;
a second semiconductor active layer disposed on the first inter-insulating layer to correspond to the second gate electrode a second inter-insulating layer covering the second semiconductor active layer;
first and second electrodes disposed on the second inter-insulating layer and making contact with the first semiconductor active layer;
third and fourth electrodes disposed on the second inter-insulating layer and making contact with the second semiconductor active layer; and
a capacitor comprising a first capacitor electrode and a second capacitor electrode,
wherein:
the first semiconductor active layer comprises an oxide semiconductor, and the second semiconductor active layer comprises a material different from the oxide semiconductor;
the first capacitor electrode is formed on the gate insulating layer and under the second inter-insulating layer;
the second capacitor electrode is disposed on the second inter-insulating layer;
at least one of the first to fourth electrodes comprises:
a first conductive layer; and
a second conductive layer disposed on the first conductive layer and electrically connected to the first conductive layer;
the second capacitor electrode is integrally formed and continuous with the third electrode; and
the second capacitor electrode consists of the first conductive layer or the second conductive layer.

12. The display substrate of claim 11, wherein the oxide semiconductor comprises at least one of Zn, In, Ga, Sn, and a mixture thereof.

13. The display substrate of claim 11, further comprising an organic light emitting device electrically connected to one of the first to fourth electrodes.

14. The display substrate of claim 11, wherein at least one of the first to fourth comprises:
the first conductive layer;
the second conductive layer; and
a third conductive layer disposed under the first conductive layer.

15. The display substrate of claim 14, wherein the first conductive layer comprises aluminum.

16. The display substrate of claim 11, wherein each of the first and second gate electrodes comprises molybdenum.

* * * * *